United States Patent [19]

Bayraktaroglu et al.

[11] Patent Number: 4,539,528
[45] Date of Patent: Sep. 3, 1985

[54] TWO-PORT AMPLIFIER

[75] Inventors: Burhan Bayraktaroglu, Plano; Bumman Kim; William Frensley, both of Richardson, all of Tex.

[73] Assignee: Texas Instruments Incorporated, Dallas, Tex.

[21] Appl. No.: 528,201

[22] Filed: Aug. 31, 1983

[51] Int. Cl.³ .......................... H03F 3/60; H03C 7/38
[52] U.S. Cl. ...................................... 330/287; 333/34
[58] Field of Search .................. 330/57, 287, 307; 307/309, 460; 333/34

[56] References Cited

U.S. PATENT DOCUMENTS 4,063,186 12/1977 Rubin ................................ 330/287

Primary Examiner—James B. Mullins
Assistant Examiner—G. Wan
Attorney, Agent, or Firm—James T. Comfort; Melvin Sharp; Robert Groover

[57] ABSTRACT

A two-port monolithic microwave amplifier, which uses a distributed negative resistance diode with gain (such as an IMPATT diode) as an active element. The diode is tapered (increasing in width but not in thickness) so that, as the RF signal propagates along the diode, it sees a wider and wider active diode region. This diode is operated in the power-saturated region, so that, as the RF signal propagates along the diode, terminal voltage remains essentially constant, but the RF current increases. This configuration is inherently unidirectional.

6 Claims, 7 Drawing Figures

TWO-PORT DIMPATT AMPLIFIER

TRAVELLING WAVE IMPATT DIODE

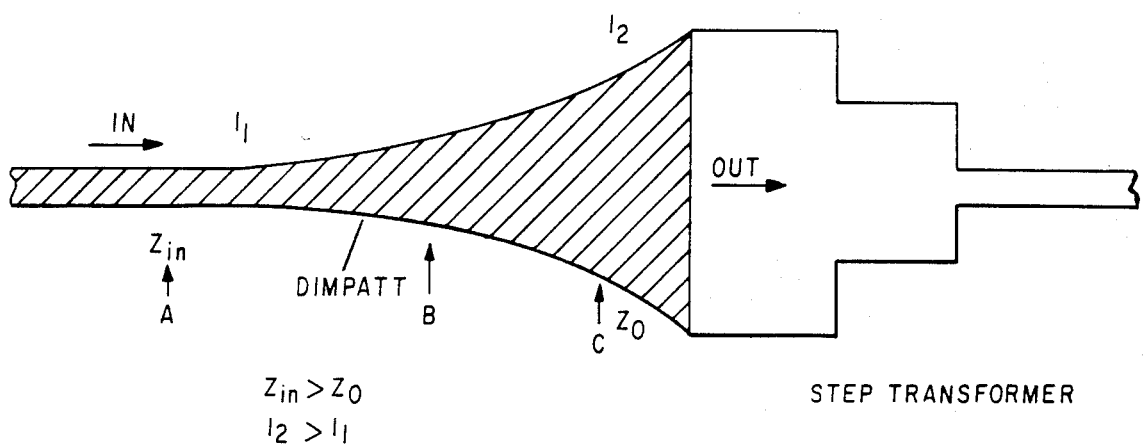
*Fig. 3*
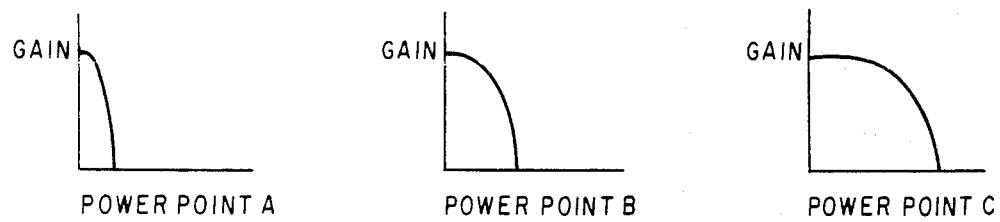
*Fig. 4A*   *Fig. 4B*   *Fig. 4C*

TWO-PORT AMPLIFIER

BACKGROUND AND SUMMARY OF THE INVENTION

The present invention relates to solid state microwave amplifiers. In particular, the present invention relates to solid-state millimeter-wave amplifiers, i.e. amplifiers which can operate at frequencies above 30 GHz. In particular, the present invention relates to solid state two-port amplifiers.

It has long been known that a number of possible mechanisms could provide a diode with gain, i.e. a two-port amplifier Device structures which provide this include tunnel diodes, Gunn diodes, and various kinds of avalanche transit-time devices and hybrids thereof, such as IMPATTS, TRAPATTs, baritts, tunetts, etc.

To get reasonably high power out of these possible solid state mechanisms, e.g. to get a power of at least several watts at frequencies above 30 GHz, it is desirable to use a distributed structure, that is a structure in which the gain medium of a diode is distributed over a substantial area, and a laterally propagating wave is amplified due to gain properties of the diode.

However, a great difficulty in achieving amplification rather than oscillation with such structures has been self-isolation. That is, a distributed active medium which is capable of amplifying a small input signal will presumably also be capable of amplifying small reflected signals from its own output. At higher microwave frequencies, it is exceedingly difficult to achieve output transitions and connections which do not cause at least some reflection, and it has therefore been very difficult to operate a distributed diode device in a configuration which reliably will not include resonances.

Thus it is an object of the present invention to provide a distributed diode with gain which is self-isolating.

It is a further of the present invention to provide a distributed diode with gain which is self-isolating and can provide substantial output power at microwave frequencies at 30 GHz.

It is a further object of the present invention to provide a distributed diode with gain which provides unidirectional amplification.

It is a further object of the present invention to provide a distributed diode with gain which provides unidirectional amplification at higher microwave frequencies.

It is a further of the present invention to provide a distributed diode with gain which provides unidirectional amplification at frequencies above 30 GHz at power levels above 1 watt.

It is also desirable to be able to fabricate device structures meeting the above criteria monolithically. That is, it is now possible to fabricate devices for small-signal amplification and signal processing at microwave frequencies on chip. Using MESFETs or HEMT (FET using wide-band gap material to provide a two dimensional electron gas under the gate), it is even possible to reliably fabricate such devices for operation at frequencies above 30 GHz. However, large signal amplification remains a problem. In particular, even where a subsequent power amplifier stage can be provided, the wave length dimensions at millimeter-wave frequencies are so small that mechanical difficulties in fabrication mean that interconnections between discrete packages may themselves act as antennas. Thus, a substantial fraction of the power output from a chip may be dissipated as radiation. Moreover, radiated power from other sources may also be coupled into the interconnections inadvertently. Finally, there are many applications, such as millimeter phased array radar and tactical infantry communications, where even the modest amounts of power which are thermally safe in integated circuit packaging would be exceedingly useful as an RF output. Thus it is an object of the present invention to provide an integrated circuit capable of amplifying microwave signals above 30 GHz to power levels more than 100 milliwatts.

It is a further of the present invention to provide an integrated circuit capable of amplifying microwave signals above 30 GHz to power levels of 1 watt.

The present invention satisfies these and other objectives by providing a distributed microwave diode which has a tapered active region. Preferably an IMPATT diode is used. The diode is operated in the power-saturated region. That is, normal IMPATT operation takes place in the vertical direction, within a conventional IMPATT structure (e.g. two heavily doped horizontal contact layers, vertically separated by a lightly doped drift region). An RF signal propagating along this diode (which may be considered as a parallel-plate transmission line) will couple to the vertical IMPATT currents, so that the RF signal experiences gain in the horizontal direction. This will increase until the horizontally propagating RF signal is in a power saturating mode, i.e. the gain of the device. In the present invention, the diode is made long enough that, after the propagating RF signal is already voltaged saturated, it continues to propagate through a diode section wherein the width of the diode is constantly increasing. That is, since the vertical thickness of the diode active region remains the same, the saturated RF voltage remains the same, but, since the width of the diode is now increased, the RF current increases. Thus, additional power gain is provided in the tapered portion of the diode. Unidirectionality is provided in the large-signal case, because of the power saturation effects. That is, as a reflective signal (a backward wave perturbation) propagates backward along the tapered diode region, it encounters region of steadily decreasing gain. That is, as the width of the diode active region narrows (in this direction) the gain of the diode decreases. The backwards-propagating wave will thus be amplified for some distance, but will eventually encounter a diode region where the backward-propagating wave is enough to reduce the gain of the diode locally below the local loss of a diode. (In the power-saturated condition which prevails at every point of the tapered region of the diode, the gain would be almost equal to the loss anyway.) Thus, the diode wil become losy at this point, and the amplitude of the backward-propagating wave will be reduced. This will also reduce the amplitude of the forward propagating wave, but the forward-propagating wave will typically be restored to the power-saturation point on the gain curve as it propagates forward into the higher-gain portions for the device. This will not occur to the backward-propagating wave, which will be damped.

According to the present invention there is provided:
1. A microwave amplifier comprising:
A semiconductor diode having top and bottom contact and an active region inbetween, said semiconductor diode being forlonged to define a transmission line;

Said a transmission line being tapered, so that said semiconductor diode active region is narrower at a first end thereof than at a second end thereof.

BRIEF DESCRIPTION OF THE DRAWINGS

The present invention will be described with reference to the accompanying drawings, wherein:

FIG. 3 shows a further embodiment of the present invention, wherein a straight region is used to achieve power saturation prior to the tapered portion of the diode; and FIGS. 4A-4C show gain-power curves for different points on the structure of FIG. 3.

DESCRIPTION OF THE PREFERRED EMBODIMENTS

Figure 1:
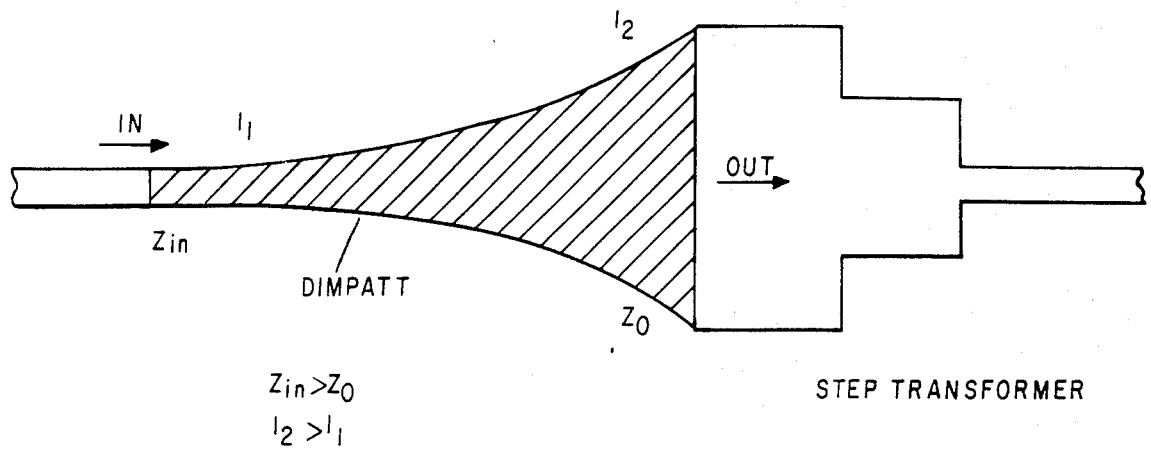
FIG. 1 shows a plan view of the first embodiment of the invention.

FIG. 1 shows the diode structure of the presently preferred embodiment. The maximum dimension of this is preferably less than a half wave length at the frequencies of operation. For example, for 50 GHz operation the diode portion shown is preferably less than half a millimeter. This diode acts as a transmission line.

The present invention is not by any means limited to distributed IMPATT diodes, but is in general applicable to a distributed realization of any 2-terminal device with negative resistance. That is, applicable device types which may be realized in a distributed mode include not only IMPATTs and other Transit-Time Devics (such as BARITTS, Tunnetts, TRAPATTS, Heterojunction IMPATTs, DOVATTs etc.), but also transferred-electron devices (Gunn oscillators, etc.) and tunnel diodes. However, the presently preferred embodiment uses an IMPATT diode, and this embodiment will be discussed primarily. It should be noted that IMPATT diodes have a particular advantage of good high-frequency characterisics and are preferable to many of the other 2-terminal device types for this reason. However, the scope of the present invention is not limited except as specified in the claims.

A travelling-wave IMPATT is basically a long strip of IMPATT diode. The depletion layer becomes a parallel plate wave guide which supports a travelling-wave. Due to the distributed nature of the device, the power-frequency limitations associated with conventional lumped diodes do not apply. The devices can therefore be made much larger in area than the conventional IMPATTs giving high power handling capability.

Figure 2A:
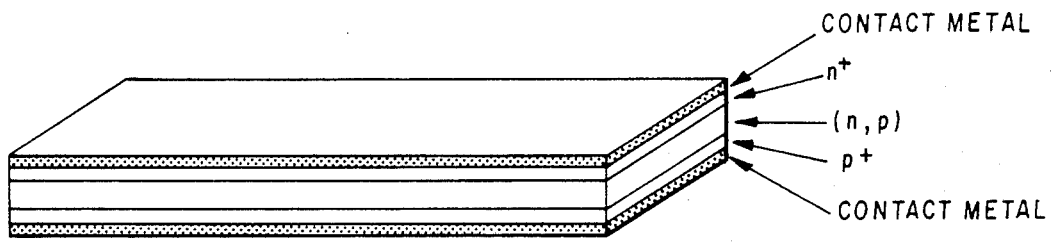
FIG. 2A shows a sectional view of a sample embodiment of the present invention, where an IMPATT diode is used as the active diode region

A typical structure is shown in FIG. 2A. In this example, the IMPATT structure is of single-drift type with the drift region made of n-type GaAs. The depletion region terminals (p+ and n+ layers) form the boundary for the waveguide. The device is shunt resonated at the depletion layer boundries, taking full advantage of the high negative resistance of the active layer.

The key advantages of a travelling-wave IMPATT are at least two:

(1) High power capability due to increased device area for a given frequency.
(2) Built-in impedance matching capability. No external circuitry is, therefore, needed. In the millimeter-wave range this is an important consideration, since the external resonant circuits become more difficult to design and produce than the IMPATT device itself.

Distributed IMPATTs can best be produced in a monolithic form for ease in handling and high efficiency impedance matching. In the millimeter-wave range, the length and the width of the device are typically 1-5 mm and 10-100 microns respectively. This represents no particular problem in production. A tapered or stepped impedance transformer can be produced on SI GaAs to match the load and the device impedances. It is possible to use microstrip lines on 4 mil and 2 mil SI GaAs substrate up to at least 100 GHz and 250 GHz respectively. Also, for a depletion width of 0.3 um, the first cut-off frequency of the next higher mode of the transmission line of the distributed IMPATT made of GaAs, is $1.4 \times 10^{14}$ Hz which is much higher than the transit-time frequency (i.e. 100 GHz for this depletion layer thickness).

The present invention teaches distributed microwave negative resistance diode which has a tapered active region. Preferably an IMPATT diode is used. The diode is operated in the power-saturated region. That is, normal IMPATT operation takes place in the vertical direction, within a conventional IMPATT structure (e.g. two heavily doped horizontal contact layers, vertically separated by a lightly doped drift region). An RF signal propagating along this diode (which may be considered as a parallel-plate transmission line) will couple to the vertical IMPATT currents, so that the RF signal experiences gain in the horizontal direction. This will increase until the horizontally propagating RF signal is in a power saturating mode, i.e. until the RF gain is decreasing with power. In the present invention, the diode is made long enough that, after the propagating RF signal is already voltage saturated, it continues to propagate through a diode section wherein the width of the diode is continuously increasing. That is, since the vertical thickness of the diode active region remains the same, the saturated RF voltage remains the same, but, since the width of the diode is now increased, the RF current increases. Thus, additional power gain is provided in the tapered portion of the diode. Unidirectionality is provided in the large-signal case, because of the power saturation effects. That is, as a reflected signal current (a backward wave perturbation) propagates backward along with tapered diode region, it encounters region of steadily decreasing gain. That is, as the width of the diode active region narrows (in this direction) the gain of the diode decreases. The backwards-propagating wave will thus be amplified for some distance, but will eventually encounter a diode region where the backward-propagating wave is enough to reduce the gain of the diode locally below the local loss of a diode. The power stored in the narrow regions of the device is smaller than the power in wider regions. Any power reflected from the wider region attempting to gain magnitude will push the gain coefficients of narrow regions down rapidly. (In the power-saturated condition which prevails at every point of the tapered region of the diode, the gain would be close to the loss anyway.) Thus, the diode will become lossy at this point, and the amplitude of the backward-propagating wave will be reduced. This will also reduce the amplitude of the forward propagating wave, but the forward-propagating wave will typically be restored to the power-saturation point on the gain curve as it propagates forward into the higher-power portions of the device.) This will not occur for the backward-propagating wave, which will be damped . Any reduction of the forward propagating wave caused by the backward propagating wave, will in turn cause a reduction in the magnitude of the backward wave a short time after. A few cycles later the system will settle at a steady state condition satisfying all requirements.

This is the effective key to achieving the predominantly unidirectional amplification achieved by the present invention. FIGS. 4A-4C show the gain-power curves at the points marked A B and C in FIG. 3 along the length of the tapered region of the IMPATT according to the present invention. In each case, operation in the power-saturated condition means that the operating point will be close to the point where the gain and loss curves cross. The device taper is preferably small enough so that power saturation conditions are satisfied at every point along the device (e.g. doubling every 100 microns). As a backward-propagating perturbation propagates further through the active region, it will increase in amplitude. Simultaneously, as seen in the curves of FIGS. 4A-4C shows, the gain curve itself becomes more sharply sloped, so that power saturation is reached at a lower level, since the active region of the diode has smaller width. As the backward-propagating wave propagates thru regions having positive gain, it will increase in the amplitude. However, at some point the amplitude of a backward propagating wave is sufficient to push the operating point of a diode over into the lossy region, i.e. the diode will receive an RF voltage which is sufficiently high that the loss mechanisms exceed the gain mechanisms. As the backward wave propagates further, it is attenuated further.

It should be noted that this mechanism lowers the voltage gain of a backward-propagating wave. However, since the backward-propagating wave is proceeding though an impedance transition, i.e. into higher impedances, the voltage of the backward-propagating wave would have increased even without gain, due to the impedance transformation. Thus the backward propagating wave will begin to lose power even before its voltage is lowered.

In addition, if the lossy region is long enough that the forward-propagating wave is not returned to full power saturation at the output, this effect will further reduce the amplitude of the reflections which cause backward-propagating waves.

In the further embodiment of the present invention, a straight distributed diode region is provided before the tapered diode region, to ensure that the forward-propagating signal achieves power saturation prior to entering the tapered portion of a diode. This straight portion can also provide improved attenuation of a backward propagating wave, and therefore improve isolation.

It should be noted that the present invention will typically not provide perfect unidirectional isolation. However, a gain differential of 5 decibels or more is sufficient to provide high-power amplification which is reasonably free of resonances. Of course, it is still desirable to minimize reflections in the output circuitry.

It should be noted that the output of this diode has a substantly lower impedance than the input, so that an impedance transformer is preferably used, such as that shown in FIG. 1.

Figure 2B:
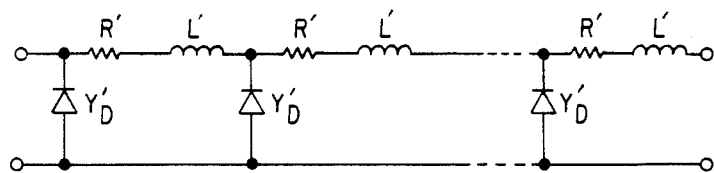
FIG. 2B shows an equivalent distributed circuit diagram of this embodiment.

FIG. 2 shows a sectional view of a distributed device according to the present invention. A substrate 10 is provided, such as semi-insulating GaAs. Semi-insulating GaAs is preferred because it provides for convenient integration of a distributed device of the present invention with other monolithic microwave integrated circuit components such as FET, Varactors, etc. However, other substrates may be preferred for better heat sinking. That is, the present invention could also be formed (using different process techniques) as a miniature hybrid structure on a diamond, BcO, silver, or thick gold-plated substrate. The importance of heat-sinking depends partly on the operation mode: that is, a pulse-mode operation at a low duty cycle imposes less stringent requirements on heat-sinking than high-duty-cycle or cw applications.

Atop the semi-insulating (e.g. chrome-doped) GaAs substrate are formed an n+ layer and an active device region. In the presently preferred embodiment, these layers are deposited by molecular beam epitaxy. However, other methods well known to those skilled in the art may be used to form the structure. The semiconductor layers in the active region of the device of the present invention are not themselves novel, and a wide variety of prior-art semiconductor structures may be used. The presently preferred embodiment uses a conventional double-drift IMPATT structure, wherein a backside contact layer which is heavily doped is overlaid by an n-type drift region, a p-type drift region, and a p+ contact region. In the presently preferred embodiment, for operation in the neighborhood of 50 GHz, the drift regions are each about 300 nano-meters thick. This thickness will be preferably scaled according to frequency, as as well known to those still in the art. For example, for operation at 94 GHz, the layers would each be approximately 200 nanometers thick, for the same doping indensity. In the presently preferred embodiment, the doping density of the layers is each approximately 3 E 17 per cc, but, as well known to those skilled in the art different doping levels can be chosen. The doping and thickness of these layers are preferably chosen so that the depletion layer surrounding the junction between layers spreads just to the edge of the contact layers at the operating voltage (which must be close to the breakdown voltage).

In the presently preferred embodiment the p+ layer is reasonably thin, e.g. 200 nm, but this thickness could be varied. It is essential that the p+ contact layer be thinner than the skin depth at frequencies of interest, but this is not an important constraint, since, for GaAs, the skin depth at 94 GHz is several microns.

As is noted, it is preferably that the length of the tapered diode according to the present invention be less than a wavelength at the operating frequency, and preferably less than half a wavelength. This limitation helps avoid resonances caused by the interaction between the forward-propagating wave and the backward-propagating reflected wave, as discussed above.

The taper of the active region is shown as an exponential taper, but this is not necessary. A hypobolic cosine taper, linear taper, parabolic taper, or other taper may be used.

To combine multiple devices according to the present invention, to achieve both high gain and high power, devices are preferably cascaded. That is, a first device having a narrow input has an active region length which is less than one half wave length. The output of this first active region is impedance transformed and provided as input to a second distributed IMPATT device. The second distributed diode has a width which is also tapered, but which is a multiple of the width of the first active region both at its input and its output. By this means, a small-signal input can be amplified up to a large-signal output, without any one device being longer than a half wave length. Similarly, it is desirable to keep the distances between devices successfully connected in fashion below a wave length, again to avoid the possiblity of microwave or VHf resonances.

Since the output of the amplifier of the present invention is saturated, it is preferably operated either to amplify frequency- or phase-modulated signals, or to provide a pulsed output gated by the bias potential.

The present invention is preferably fabricated as a monolithic circuit on a semi-insulating GaAs substrate as described, but may also be fabricated in a wide variety of other forms, indicating hybrid forms. The present invention teaches a fundamental innovation in microwave amplifier art. The scope of the present invention is therefore is not limited except as set forth in the accompanying claims, which are to be construed broadly.

What is claimed is:

1. A microwave amplifier comprising:
    a semiconductor diode having top and bottom contact and an active region inbetween, said semiconductor diode being prolonged to define a transmission line;
    said transmission line being tapered, so that said semiconductor diode active region is narrower at a first end thereof than at a second end thereof.

2. The device of claim 1, further comprising means for coupling an input signal to said first end of said diode; and
    means for coupling an output signal out of said second end of said diode.

3. The device of claim 2, wherein said output coupling means comprises an impedance transformation means.

4. The device of claim 2, wherein said diode structure comprises an IMPATT diode.

5. A microwave amplifier comprising first and second distributed diodes connected in a series, wherein each distributed diode comprises:
    a semiconductor diode having top and bottom contact and an active region inbetween, said semiconductor diode being prolonged to define a transmission line;
    and further comprising means for impedance-matching the output of said first diode to the input of said second diode;
    and wherein said input of said second diode is wider than said input of said first diode.

6. The amplifier of claim 5, wherein said first diode is connected to receive frequencies in the neighborhood of a first microwave frequency, and wherein both said first diode and said second diode are less than one half wave length long at said first microwave frequencies.

* * * * *